US008609777B2

(12) United States Patent
Prejean et al.

(10) Patent No.: US 8,609,777 B2
(45) Date of Patent: *Dec. 17, 2013

(54) CROSS-LINKABLE ENCAPSULANTS FOR PHOTOVOLTAIC CELLS

(75) Inventors: George Wyatt Prejean, Orange, TX (US); Rebecca L Smith, Vienna, WV (US)

(73) Assignee: E I du Pont de Nemours and Company, Wilmington, DE (US)

( * ) Notice: Subject to any disclaimer, the term of this patent is extended or adjusted under 35 U.S.C. 154(b) by 222 days.

This patent is subject to a terminal disclaimer.

(21) Appl. No.: 12/847,267

(22) Filed: Jul. 30, 2010

(65) Prior Publication Data

US 2011/0023943 A1 Feb. 3, 2011

Related U.S. Application Data

(60) Provisional application No. 61/230,238, filed on Jul. 31, 2009.

(51) Int. Cl.
*C08L 33/08* (2006.01)
*C08L 33/02* (2006.01)
*C08L 33/00* (2006.01)
*B32B 3/10* (2006.01)
*B32B 27/32* (2006.01)
*B32B 37/14* (2006.01)
*H01L 31/042* (2006.01)

(52) U.S. Cl.
USPC ........... 525/228; 525/208; 525/240; 525/221; 428/141; 428/220; 428/522; 428/523; 428/215; 524/522; 524/523; 136/251; 136/259; 156/60; 156/285

(58) Field of Classification Search
USPC .......... 136/251, 259; 525/228, 208, 240, 221; 524/522, 523; 428/141, 220, 522, 523, 428/215; 156/60, 285
See application file for complete search history.

(56) References Cited

U.S. PATENT DOCUMENTS

| | | | |
|---|---|---|---|
| 2,632,921 A | 3/1953 | Kreidl | |
| 2,648,097 A | 8/1953 | Kritchever | |
| 2,683,894 A | 7/1954 | Kritchever | |
| 2,704,382 A | 3/1955 | Kreidl | |
| 3,234,062 A | 2/1966 | Morris | |
| 3,311,517 A | 3/1967 | Keslar, et al. | |
| 3,404,134 A | 10/1968 | Rees | |
| 3,852,136 A | 12/1974 | Plumat et al. | |
| 3,957,537 A | 5/1976 | Baskett et al. | |
| 4,035,549 A | 7/1977 | Kennar | |
| 4,341,576 A | 7/1982 | Lewis | |
| 4,385,951 A | 5/1983 | Pressau | |
| 4,398,979 A | 8/1983 | Cathers et al. | |
| 4,615,989 A | 10/1986 | Ritze | |
| 4,732,814 A | 3/1988 | Hatada et al. | |
| 4,865,711 A | 9/1989 | Kittler | |
| 5,028,674 A | 7/1991 | Hatch et al. | |
| 5,173,212 A | 12/1992 | Speit et al. | |
| 5,264,286 A | 11/1993 | Ando et al. | |
| 5,411,845 A | 5/1995 | Robinson | |
| 5,415,909 A | 5/1995 | Shohi et al. | |
| 5,415,942 A | 5/1995 | Anderson | |
| 5,507,881 A | 4/1996 | Sichanugrist et al. | |
| 5,512,107 A | 4/1996 | Van Den Berg | |
| 5,536,347 A | 7/1996 | Moran | |
| 5,583,057 A | 12/1996 | Inoue | |
| 5,690,994 A | 11/1997 | Robinson | |
| 5,698,329 A | 12/1997 | Robinson | |
| 5,770,312 A | 6/1998 | Robinson | |
| 5,853,516 A | 12/1998 | Lehto | |
| 5,948,176 A | 9/1999 | Ramanathan et al. | |
| 5,994,163 A | 11/1999 | Bodegard et al. | |
| 6,040,521 A | 3/2000 | Kushiya et al. | |
| 6,075,202 A | 6/2000 | Mori et al. | |
| 6,123,824 A | 9/2000 | Sano et al. | |

(Continued)

FOREIGN PATENT DOCUMENTS

| | | |
|---|---|---|
| CA | 2388107 A1 | 4/2002 |
| EP | 0341731 A2 | 11/1989 |
| EP | 0382401 A2 | 8/1990 |
| EP | 0769818 A2 | 4/1997 |
| EP | 1176170 B1 | 1/2002 |
| EP | 1182710 B1 | 6/2006 |
| JP | 64-14235 A | 1/1989 |
| JP | 2003-212967 A | 7/2003 |
| JP | 2006-190867 A | 7/2006 |
| WO | 91/01880 A1 | 2/1991 |

(Continued)

OTHER PUBLICATIONS

Flat-Plate Solar Array Project Final Report, 1986 vol. 7: Module Encapsulation, Jet Propulsion Laboratory for the U.S. Department of Energy.

(Continued)

*Primary Examiner* — Michael M Bernshteyn
(74) *Attorney, Agent, or Firm* — Maria M. Kourtakis; Kelly Law Registry; Linda K. H. Sauerbrunn

(57) ABSTRACT

Provided herein is a blend composition useful as a cross-linkable encapsulant layer and consisting essentially of two ethylene copolymers and optionally one or more additives. The first ethylene copolymer comprises copolymerized units of ethylene, optionally a first olefin having the formula $CH_2=C(R^1)CO_2R^2$, and a second olefin having the formula $CH_2=C(R^3)COOH$. The second ethylene copolymer consists essentially of copolymerized units of ethylene, optionally a first olefin having the formula $CH_2=C(R^1)CO_2R^2$, and a third olefin having the formula $CH_2=C(R^4)D$. $R^1$, $R^3$ and $R^4$ represent hydrogen or an alkyl group; $R^2$ represents an alkyl group; and D represents a moiety containing an epoxy group. Further provided are solar cell modules comprising the encapsulant layer. The encapsulant layer comprises the blend composition or the product of cross-linking the blend composition, in which some acid groups of the second olefin have reacted with some epoxy groups of the third olefin.

22 Claims, 1 Drawing Sheet

(56) References Cited

U.S. PATENT DOCUMENTS

| | | |
|---|---|---|
| 6,137,048 A | 10/2000 | Wu et al. |
| 6,150,028 A | 11/2000 | Mazon |
| 6,204,443 B1 | 3/2001 | Kiso et al. |
| 6,258,620 B1 | 7/2001 | Morel et al. |
| 6,288,325 B1 | 9/2001 | Jansen et al. |
| 6,320,115 B1 | 11/2001 | Kataoka et al. |
| 6,323,416 B1 | 11/2001 | Komori et al. |
| 6,340,646 B1 | 1/2002 | Nagashima et al. |
| 6,342,116 B1 | 1/2002 | Balduin et al. |
| 6,461,736 B1 | 10/2002 | Nagashima et al. |
| 6,468,934 B2 | 10/2002 | Nagashima et al. |
| 6,518,365 B1 | 2/2003 | Powell et al. |
| 6,521,825 B2 | 2/2003 | Miura et al. |
| 6,613,603 B1 | 9/2003 | Sano |
| 6,753,087 B2 | 6/2004 | Jing et al. |
| 6,784,301 B2 | 8/2004 | Hackmann et al. |
| 6,797,222 B2 * | 9/2004 | Hausmann et al. ............ 264/302 |
| 6,818,819 B2 | 11/2004 | Morizane et al. |
| 6,866,901 B2 | 3/2005 | Burrows et al. |
| 2003/0119981 A1 | 6/2003 | Hausmann et al. |
| 2003/0124296 A1 | 7/2003 | Smith |
| 2004/0182493 A1 | 9/2004 | Chick |
| 2004/0265508 A9 | 12/2004 | Burrows et al. |
| 2005/0131147 A1 * | 6/2005 | Brule ............................ 525/178 |
| 2005/0247402 A1 | 11/2005 | Fujiki et al. |
| 2007/0079866 A1 | 4/2007 | Borden et al. |
| 2007/0209699 A1 | 9/2007 | Sichanugrist et al. |
| 2007/0218289 A1 * | 9/2007 | Ando et al. ................ 428/411.1 |
| 2007/0227578 A1 | 10/2007 | Perozziello et al. |
| 2007/0232057 A1 | 10/2007 | Borden et al. |
| 2007/0238285 A1 | 10/2007 | Borden |
| 2007/0240759 A1 | 10/2007 | Borden |
| 2007/0281090 A1 | 12/2007 | Kurita et al. |
| 2007/0298590 A1 | 12/2007 | Choi et al. |
| 2008/0099064 A1 * | 5/2008 | Hayes ............................ 136/251 |
| 2008/0196760 A1 | 8/2008 | Hayes et al. |
| 2008/0220193 A1 * | 9/2008 | Tohi et al. .................. 428/36.92 |
| 2008/0223436 A1 | 9/2008 | Den Boer et al. |
| 2008/0271675 A1 | 11/2008 | Choi et al. |
| 2010/0112253 A1 | 5/2010 | Hausmann et al. |
| 2010/0147363 A1 | 6/2010 | Huang et al. |
| 2010/0295091 A1 | 11/2010 | Strzegowski et al. |
| 2011/0297212 A1 | 12/2011 | Wu et al. |
| 2011/0303263 A1 | 12/2011 | Corfias-Zuccalli et al. |
| 2011/0319566 A1 | 12/2011 | Nishijima et al. |
| 2012/0024348 A1 | 2/2012 | Prejean et al. |
| 2012/0024351 A1 | 2/2012 | Prejean et al. |
| 2012/0028049 A1 | 2/2012 | Prejean et al. |
| 2012/0152323 A1 | 6/2012 | Perry et al. |
| 2012/0152324 A1 | 6/2012 | Corfias-Zuccalli et al. |

FOREIGN PATENT DOCUMENTS

| | | |
|---|---|---|
| WO | 03/057478 A1 | 7/2003 |
| WO | 2010/101582 A1 | 9/2010 |
| WO | 2010/124189 A1 | 10/2010 |

OTHER PUBLICATIONS

Pern, Adhesion Strength Study of Eva Encapsulants on Glass Substrates, Conference Paper, 2003, National Renewable Energy Laboratory, Golden Colorado.

Supplementary European Search Report and Opinion for International Application No. PCT/US2010/043909 dated Jun. 10, 2013.

* cited by examiner

CROSS-LINKABLE ENCAPSULANTS FOR PHOTOVOLTAIC CELLS

CROSS-REFERENCE TO RELATED APPLICATIONS

This application claims priority under 35 U.S.C. §119 to U.S. Provisional Appln. No. 61/230,238, filed on Jul. 31, 2009, which is incorporated herein by reference in its entirety.

FIELD OF THE INVENTION

The invention is directed to a cross-linked or cross-linkable encapsulant for solar cell modules. In particular, the cross-linkable encapsulant consists essentially of a blend composition of two ethylene copolymers, with a first ethylene copolymer incorporating residues of an unsaturated carboxylic acid and a second ethylene copolymer incorporating residues of a moiety containing an epoxy group. In the cross-linked encapsulant layer, the carboxylic acid groups have been caused to react with the epoxy groups.

BACKGROUND OF THE INVENTION

Several patents and publications are cited in this description in order to more fully describe the state of the art to which this invention pertains. The entire disclosure of each of these patents and publications is incorporated by reference herein.

Because solar cells provide a sustainable energy resource, their use is rapidly expanding. Solar cells can typically be categorized into two types based on the light absorbing material used, i.e., bulk or wafer-based solar cells and thin film solar cells.

Monocrystalline silicon (c-Si), poly- or multi-crystalline silicon (poly-Si or mc-Si) and ribbon silicon are the materials used most commonly in forming the more traditional wafer-based solar cells. Solar cell modules derived from wafer-based solar cells often comprise a series of about 180 to about 240 μm thick self-supporting wafers (or cells) that are soldered together and electrically connected. Such a panel of solar cells, along with a layer of conductive paste and/or connecting wires deposited on its surface, may be referred to as a solar cell assembly. The solar cell assembly may be encapsulated by, sandwiched between, or laminated between polymeric encapsulants. The resulting structure may be further sandwiched between two protective outer layers (i.e., front sheet and back sheet) to form a weather resistant module. The protective outer layers may be formed of glass, metal sheets or films, or plastic sheets or films. In general, however, the outer layer that faces to the sunlight needs to be sufficiently transparent to allow photons reach the solar cells.

In the increasingly important alternative, thin film solar cells, the commonly used materials include amorphous silicon (a-Si), microcrystalline silicon (μc-Si), cadmium telluride (CdTe), copper indium selenide ($CuInSe_2$ or CIS), copper indium/gallium diselenide ($CuIn_xGa_{(1-x)}Se_2$ or CIGS), light absorbing dyes, organic semiconductors, etc. By way of example, thin film solar cells are described in e.g., U.S. Pat. Nos. 5,507,881; 5,512,107; 5,948,176; 5,994,163; 6,040,521; 6,123,824; 6,137,048; 6,288,325; 6,258,620; 6,613,603; and 6,784,301; and U.S. Patent Publication Nos. 20070298590; 20070281090; 20070240759; 20070232057; 20070238285; 20070227578; 20070209699; 20070079866; 20080223436; and 20080271675.

Thin film solar cells with a typical thickness of less than 2 μm are produced by depositing the semiconductor materials onto a substrate, generally in multiple layers. Further, connecting wires, metal conductive coatings, and/or metal reflector films may be deposited over the surface of the thin film solar cells to constitute part of the thin film solar cell assembly. The substrate may be formed of glass or a flexible film and may also be referred to as superstrate in those modules in which it faces towards the sunlight. Similarly to the wafer-based solar cell modules, the thin film solar cell assemblies are further encapsulated by, laminated between, or sandwiched between, polymeric encapsulants, which are further laminated or sandwiched between protective outer layers. In certain embodiments, the thin film solar cell assembly may be only partially encapsulated by the encapsulant, which means that only the side of the thin film solar cell assembly that is opposite from the substrate (or superstrate) is laminated to a polymeric encapsulant and then a protective outer layer. In such a construction, the thin film solar cell assembly is sandwiched between the substrate (or superstrate) and the encapsulant.

Encapsulants fulfill several important functions in the solar cell module. For example, they encase and protect the solar cell materials, which may be brittle or otherwise susceptible to physical insults, such as abrasion. In addition, in some solar cell modules the encapsulant adheres the solar cells to the module's outer layers. The need for durable, transparent, easily processible encapsulants has led to the investigation of thermoplastic polymers, such as ethylene vinyl acetate (EVA), poly(vinyl butyral) (PVB), and the ionomers of ethylene acid copolymers. These materials have a long history of use as interlayers in safety glass laminates, and therefore the advantages of their use as encapsulants in solar cell modules are readily apparent. These advantages include, for example, one or more of good optical properties, suitable stability, durability, ease of processability, resistance to penetration, and favorable economic factors. Moreover, those who manufacture safety glass laminates are well-suited to develop the skills and equipment necessary to laminate solar cell modules that incorporate these familiar materials as encapsulants.

In addition, cross-linking reactions have been investigated as a means to further improve the stability, durability and penetration resistance of thermoplastic polymeric encapsulants. For example, Japanese Unexamined Patent Publication 2003-212967 describes a thermosetting resin which, before being thermally cured, is fluid and can be formed into a thin film.

Cross-linkable ethylene vinyl acetate (EVA) has also been widely used as an encapsulant material in solar cell modules due to its low cost, high clarity, low modulus, low initial viscosity, low equilibrium moisture level, and good heat resistance. The use of cross-linkable EVA as encapsulant materials is not without disadvantages, however. For example, the liberation of acetic acid by EVA can lead to corrosion and yellowing of the EVA encapsulant. Also, peroxides are often incorporated in the EVA encapsulant as a reagent of the cross-linking reaction. Thus, the shelf life of the EVA encapsulant may be reduced by the peroxides' decomposition. Further disadvantageously, peroxides decompose to evolve oxygen, which may cause optical flaws such as bubbles to form in the EVA encapsulant.

Finally, these EVA sheets must be produced at comparatively low extrusion temperatures to prevent premature cross-linking, that is, cross-linking prior to lamination to form the solar cell module. Premature cross-linking may render the EVA unprocessible so that the lamination of the solar cell modules cannot take place at typical temperatures. A prematurely cross-linked EVA will not flow to conform to the solar cells and other components of the solar cell module, nor will it adhere the solar cells to the outer layers of the module.

It is therefore apparent that a need exists for a cross-linkable thermoplastic polymeric encapsulant material that can be processed in the melt at typical extrusion temperatures and typical lamination temperatures.

SUMMARY OF THE INVENTION

Accordingly, provided herein is a blend composition useful as a cross-linkable encapsulant layer and consisting essentially of two ethylene copolymers and optionally one or more additives. The first ethylene copolymer comprises copolymerized units of ethylene, optionally a first olefin having the formula $CH_2=C(R^1)CO_2R^2$, and a second olefin having the formula $CH_2=C(R^3)COOH$. The second ethylene copolymer consists essentially of copolymerized units of ethylene, optionally a first olefin having the formula $CH_2=C(R^1)CO_2R^2$, and a third olefin having the formula $CH_2=C(R^4)D$. $R^1$, $R^3$ and $R^4$ represent hydrogen or an alkyl group; $R^2$ represents an alkyl group; and D represents a moiety containing an epoxy group. Further provided are solar cell modules comprising the encapsulant layer. The encapsulant layer comprises the blend composition or the product of cross-linking the blend composition, in which some acid groups of the second olefin have reacted with some epoxy groups of the third olefin.

These and various other advantages and features of novelty that characterize the invention are pointed out with particularity in the claims annexed hereto and forming a part hereof. For a better understanding of the invention, its advantages, and the objects obtained by its use, however, reference should be made to the drawings which form a further part hereof, and to the accompanying descriptive matter, in which there is illustrated and described a preferred embodiment of the invention.

DETAILED DESCRIPTION OF THE INVENTION

Figure 1:
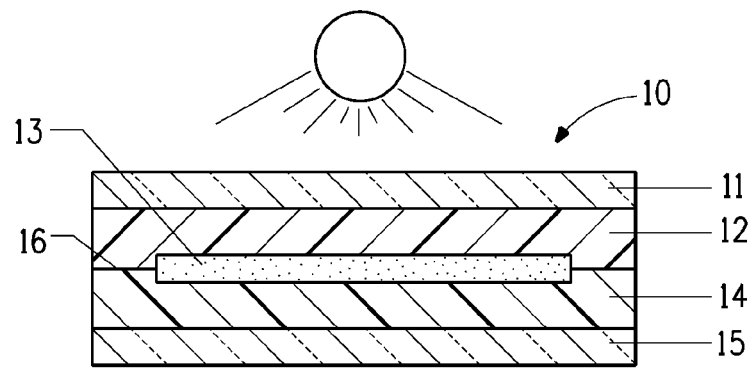
FIG. 1 is a cross-sectional view of a solar cell module, not drawn to scale.

The following definitions apply to the terms as used throughout this specification, unless otherwise limited in specific instances.

Unless otherwise defined, all technical and scientific terms used herein have the same meaning as commonly understood by one of ordinary skill in the art to which this invention belongs. In case of conflict, the specification, including definitions, will control.

As used herein, the terms "comprises," "comprising," "includes," "including," "containing," "characterized by," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

The transitional phrase "consisting of" excludes any element, step, or ingredient not specified in the claim, closing the claim to the inclusion of materials other than those recited except for impurities ordinarily associated therewith. When the phrase "consists of" appears in a clause of the body of a claim, rather than immediately following the preamble, it limits only the element set forth in that clause; other elements are not excluded from the claim as a whole.

The transitional phrase "consisting essentially of" limits the scope of a claim to the specified materials or steps and those that do not materially affect the basic and novel characteristic(s) of the claimed invention. A 'consisting essentially of' claim occupies a middle ground between closed claims that are written in a 'consisting of' format and fully open claims that are drafted in a 'comprising' format. Optional additives as defined herein, at levels that are appropriate for such additives, and minor impurities are not excluded from a composition by the term "consisting essentially of".

When a composition, a process, a structure, or a portion of a composition, a process, or a structure, is described herein using an open-ended term such as "comprising," unless otherwise stated the description also includes an embodiment that "consists essentially of" or "consists of" the elements of the composition, the process, the structure, or the portion of the composition, the process, or the structure.

The term "substantially free", as used herein with respect to a composition and a component, refers to a composition that includes no more than an adventitious amount of the component. Stated alternatively, the composition includes no added amount of the component, only the amount that is commonly present in the raw materials from which the composition is produced. In some commercially available materials, the level of adventitious components is less than less than 2.5%, 1.0%, less than 0.5%, or less than 0.1% by weight, based on the weight of the commercially available material.

The articles "a" and "an" may be employed in connection with various elements and components of compositions, processes or structures described herein. This is merely for convenience and to give a general sense of the compositions, processes or structures. Such a description includes "one or at least one" of the elements or components. Moreover, as used herein, the singular articles also include a description of a plurality of elements or components, unless it is apparent from a specific context that the plural is excluded.

The term "or", as used herein, is inclusive; that is, the phrase "A or B" means "A, B, or both A and B". More specifically, a condition "A or B" is satisfied by any one of the following: A is true (or present) and B is false (or not present); A is false (or not present) and B is true (or present); or both A and B are true (or present). Exclusive "or" is designated herein by terms such as "either A or B" and "one of A or B", for example.

The term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such.

In addition, the ranges set forth herein include their endpoints unless expressly stated otherwise. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed. The scope of the invention is not limited to the specific values recited when defining a range.

When materials, methods, or machinery are described herein with the term "known to those of skill in the art", "conventional" or a synonymous word or phrase, the term signifies that materials, methods, and machinery that are conventional at the time of filing the present application are encompassed by this description. Also encompassed are materials, methods, and machinery that are not presently conventional, but that will have become recognized in the art as suitable for a similar purpose.

Unless stated otherwise, all percentages, parts, ratios, and like amounts, are defined by weight.

As used herein, the term "copolymer" refers to polymers comprising copolymerized units resulting from copolymerization of two or more comonomers. In this connection, a copolymer may be described herein with reference to its constituent comonomers or to the amounts of its constituent comonomers, for example "a copolymer comprising ethylene and 18 weight % of acrylic acid", or a similar description. Such a description may be considered informal in that it does not refer to the comonomers as copolymerized units; in that it does not include a conventional nomenclature for the copolymer, for example International Union of Pure and Applied Chemistry (IUPAC) nomenclature; in that it does not use product-by-process terminology; or for another reason. As used herein, however, a description of a copolymer with reference to its constituent comonomers or to the amounts of its constituent comonomers means that the copolymer contains copolymerized units (in the specified amounts when specified) of the specified comonomers. It follows as a corollary that a copolymer is not the product of a reaction mixture containing given comonomers in given amounts, unless expressly stated in limited circumstances to be such. The term "terpolymer" refers to polymers consisting essentially of three monomers.

The terms "epoxy group", "ethylene oxide group" and "oxirane ring" are synonymous and used interchangeably herein to refer to a substituted or unsubstituted group having the formula —CROCR$_2$, wherein the oxygen atom is bound to both carbons and the carbons are bound to each other. When the R groups are hydrogen atoms, the ethylene oxide group is unsubstituted. The ethylene oxide group may be singly or multiply substituted. Stated alternatively, one, two or three of the R groups may be other than hydrogen atoms.

The terms "alkyl group" and "alkylene group", as used herein alone or in combined form, such as, for example, "alkoxy group", refer to saturated hydrocarbon groups that have from 1 to 8 carbon atoms and that may be branched or unbranched. An alkyl group has one bond to a carbon atom available for substitution, and an alkylene group has two bonds to one or more carbon atoms available for substitution.

Finally, the term "solar cell" as used herein includes any article which can convert light into electrical energy. Solar cells useful in the invention include, but are not limited to, wafer-based solar cells (e.g., c-Si or mc-Si based solar cells), thin film solar cells (e.g., a-Si, μc-Si, CdTe, or CI(G)S based solar cells), and organic solar cells.

Provided herein is a solar cell module that comprises (A) at least one encapsulant layer comprising a cross-linked or cross-linkable blend composition of Ethylene Copolymer 1 and Ethylene Copolymer 2 and B) a solar cell assembly comprising one or a plurality of solar cells.

Ethylene Copolymer 1 is a copolymer comprising copolymerized units of ethylene, optionally of a first olefin of the formula $CH_2=C(R^1)CO_2R^2$, and of a second olefin of the formula $CH_2=C(R^3)COOH$, wherein $R^1$ is hydrogen or an alkyl group; $R^2$ is an alkyl group, or $R^2$ is an alkyl group substituted with an —OH group, such as a hydroxyethyl group, or $R^2$ is an alkyl group substituted with an alkoxy group, such as a methoxyethyl or an ethoxy ethyl group; and $R^3$ is hydrogen or an alkyl group.

Suitable first olefins having the formula $CH_2=C(R^1)CO_2R^2$ include, without limitation, methyl acrylate, methyl methacrylate, ethyl acrylate, ethyl methacrylate, butyl acrylate, and butyl methacrylate. Preferably, the first olefin having the formula $CH_2=C(R^1)CO_2R^2$ is selected from n-butyl acrylate. iso-butyl acrylate, methyl methacrylate and n-butyl methacrylate. Suitable second olefins having the formula $CH_2=C(R^3)COOH$ include, without limitation, acrylic acids and methacrylic acids. Ethylene Copolymer 1 is not an ionomer. In particular, the carboxylic acid groups of Ethylene Copolymer 1 are present in protonated form and no significant amount of these carboxylic acid groups is neutralized to form carboxylate salts.

In addition, the Ethylene Copolymer 1 may optionally further comprise other suitable additional comonomers, such as unsaturated carboxylic acids having 2 to 10, or preferably 3 to 8 carbons, or derivatives thereof. Suitable acid derivatives include acid anhydrides, amides, and esters. Esters are preferred. Specific examples of preferred esters of unsaturated carboxylic acids include, but are not limited to, methyl acrylates, methyl methacrylates, ethyl acrylates, ethyl methacrylates, propyl acrylates, propyl methacrylates, isopropyl acrylates, isopropyl methacrylates, butyl acrylates, butyl methacrylates, isobutyl acrylates, isobutyl methacrylates, tert-butyl acrylates, tert-butyl methacrylates, octyl acrylates, octyl methacrylates, undecyl acrylates, undecyl methacrylates, octadecyl acrylates, octadecyl methacrylates, dodecyl acrylates, dodecyl methacrylates, 2-ethylhexyl acrylates, 2-ethylhexyl methacrylates, isobornyl acrylates, isobornyl methacrylates, lauryl acrylates, lauryl methacrylates, 2-hydroxyethyl acrylates, 2-hydroxyethyl methacrylates, glycidyl acrylates, glycidyl methacrylates, poly(ethylene glycol)acrylates, poly(ethylene glycol)methacrylates, poly(ethylene glycol) methyl ether acrylates, poly(ethylene glycol) methyl ether methacrylates, poly(ethylene glycol) behenyl ether acrylates, poly(ethylene glycol) behenyl ether methacrylates, poly(ethylene glycol) 4-nonylphenyl ether acrylates, poly(ethylene glycol) 4-nonylphenyl ether methacrylates, poly(ethylene glycol) phenyl ether acrylates, poly(ethylene glycol) phenyl ether methacrylates, vinyl acetates, vinyl propionates, and combinations of two or more thereof. Examples of preferred comonomers include, but are not limited to, methyl (meth)acrylates, butyl (meth)acrylates, vinyl acetates, and combinations of two or more thereof.

Neither the first olefin nor the second olefin nor the other suitable additional comonomer, however, is a dicarboxylic acid or a diester, monoester or anhydride of a dicarboxylic acid. Dicarboxylic acids include maleic acid, fumaric acid, itaconic acid, citraconic acid, mesaconic acid, and the like. In addition, Ethylene Copolymer 1 preferably does not incorporate other comonomers in any significant amount. Stated alternatively, it is preferable that Ethylene Copolymer 1 consist essentially of copolymerized residues of ethylene and the second olefin, or that Ethylene Copolymer 1 consist essentially of copolymerized residues of ethylene, the optional first olefin and the second olefin.

Ethylene Copolymer 1 comprises about 5 to about 40 wt %, or about 10 to about 35 wt %, or about 10 to about 30 wt % of copolymerized residues of the first olefin of formula $CH_2=C(R^1)CO_2R^2$, when the first olefin is present. Ethylene Copolymer 1 further comprises about 2 to about 30 wt %, or about 5 to about 20 wt %, or about 5 to about 15 wt %, based on the total weight of the copolymer, of copolymerized residues of the olefin of the formula $CH_2=C(R^3)COOH$. The remainder of Ethylene Copolymer 1 comprises copolymerized residues of ethylene and up to about 5 wt % of optional additional comonomers, if any. These weight percentages are based on the total weight of Ethylene Copolymer 1.

In addition, Ethylene Copolymer 1 has a melt flow rate or melt index (MFR or MI) of about 5 g/10 min or higher, or about 30 g/10 min or higher, or about 30 to about 500 g/10 min, or about 60 g/10 min or higher, or about 60 to about 200 g/10 min, as determined in accordance with ASTM D1238 at 190° C. and under a weight of 2.16 kg.

In one particular example, Ethylene Copolymer 1 is a copolymer of ethylene/n-butyl acrylate/acrylic acid, such as those available from E. I. du Pont de Nemours and Company, Wilmington, Del. ("DuPont") under the trademark Nucrel®.

Ethylene Copolymer 2 is a copolymer comprising copolymerized units of ethylene, optionally of the first olefin of the formula $CH_2=C(R^1)CO_2R^2$, and of a third olefin of the formula $CH_2=C(R^4)D$, wherein $R^4$ is hydrogen or an alkyl group; D is selected $-CO_2R^5$, $-CO_2R^6-R^5$, $-R^6-R^5$, $-O-R^5$, $-R^5$; and wherein $R^6$ is an alkylene group and $R^5$ is a moiety containing an epoxy group, such as a glycidyl group, a 1,2-cyclohexenyl oxide group, or a 1,2-epoxy group. Like the first and the second olefins and the optional additional comonomers, the third olefin is also not a dicarboxylic acid or a di-ester, mono-ester or anhydride of a dicarboxylic acid.

In addition, Ethylene Copolymer 2 may optionally further comprise other suitable additional comonomers, as described above with respect to Ethylene Copolymer 1. Preferably, however, Ethylene Copolymer 2 does not incorporate other comonomers in any significant amount. Stated alternatively, it is preferable that Ethylene Copolymer 2 consist essentially of copolymerized residues of ethylene and the third olefin, or that Ethylene Copolymer 2 consist essentially of copolymerized residues of ethylene, the optional first olefin and the third olefin Whether the first olefin is present in Ethylene Copolymer 2 is independent of whether it is also present in Ethylene Copolymer 1, and vice versa. Moreover, when the first olefin is present in both of Ethylene Copolymers 1 and 2, the olefin itself may be the same or different in each of the copolymers. For example, Ethylene Copolymer 1 may be a copolymer of ethylene/n-butyl acrylate/acrylic acid and Ethylene Copolymer 2 may be a copolymer of ethylene/n-butyl acrylate/glycidyl methacrylate. Alternatively, Ethylene Copolymer 1 may be a copolymer of ethylene/methyl acrylate/acrylic acid and Ethylene Copolymer 2 may be a copolymer of ethylene/ethyl acrylate/glycidyl methacrylate.

Ethylene Copolymer 2 comprises about 3 to about 15 wt %, or about 3 to about 10 wt %, or about 4 to about 7 wt % of copolymerized residues of the third olefin of the formula $CH_2=C(R^4)-D$. It may optionally further comprise up to about 40 wt %, or about 5 to about 40 wt %, or about 10 to about 40 wt %, or about 20 to about 40 wt %, or about 20 to about 35 wt % of copolymerized residues of the first olefin of the formula $CH_2=C(R^1)CO_2R^2$. The remainder of Ethylene Copolymer 2 comprises copolymerized residues of ethylene and up to about 5 wt % of optional additional comonomers, if any. These weight percentages are based on the total weight of Ethylene Copolymer 2.

Preferably, Ethylene Copolymer 2 consists essentially of copolymerized residues of ethylene and the third olefin. Also preferably, Ethylene Copolymer 2 consists essentially of copolymerized residues of ethylene, the optional first olefin and the third olefin. In one particular example, the Ethylene Copolymer 2 is a copolymer of ethylene/n-butyl acrylate/glycidyl methacrylate, such as those available from DuPont under the trademark Elvaloy®. In another particular example, Ethylene Copolymer 2 is a copolymer of ethylene and glycidyl methacrylate.

In addition, Ethylene Copolymer 2 has a melt flow rate of about 5 to about 300 or about 5 to about 100 g/10 min, as determined in accordance with ASTM D1238 at 190° C. and under a weight of 2.16 kg.

The ratio of the Ethylene Copolymer 1 and the Ethylene Copolymer 2 in the blend composition ranges from about 90:10 to about 10:90, or about 80:20 to about 20:80, or about 70:30 to about 30:70, or about 60:40 to about 40:60, or about 45:55 to 55:45, or the ratio is about 50:50 by weight based on the total weight of Ethylene Copolymer 1 and Ethylene Copolymer 2 in the blend composition.

The mole ratio of carboxylic acid groups in Ethylene Copolymer 1 to epoxy groups in Ethylene Copolymer 2 is preferably about 10:1 to 1:10, about 5:1 to 1:5, about 3:1 to 1:3, or about 2 to 1.

The blend composition of Ethylene Copolymer 1 and Ethylene Copolymer 2 can be prepared by any suitable process, such as melt blending, compounding, and extrusion to pelletized blend. Preferably, no water, no other solvents such as organic solvents and aromatic solvents, and no plasticizers are added to the Ethylene Copolymer 1 and Ethylene Copolymer 2 during the blending process. Stated alternatively, in a preferred process, neat Ethylene Copolymer 1 is combined with neat Ethylene Copolymer 2 in a melt process to form a neat blend composition. At no time during the preferred process do Ethylene Copolymers 1 and 2 include more than adventitious amounts of water, other solvent, or plasticizer.

During the blending and extruding processes, the temperature of the blend is preferably maintained at or below about 135° C., to prevent premature cross-linking. More preferably, the temperature of the blend is maintained at or below about 130° C., 125° C. or 120° C. At temperatures of about 120° C. or higher, the carboxylic acid group in Ethylene Copolymer 1 reacts with the epoxy group in Ethylene Copolymer 2 to form a blend composition that is cross-linked. More specifically, the cross-linking reaction between a copolymer comprising acrylic acid residues and a copolymer comprising residues of glycidyl methacrylate proceeds according to Scheme 1, below, in which the term "Poly" refers to the remainder of the polymer chain.

SCHEME 1

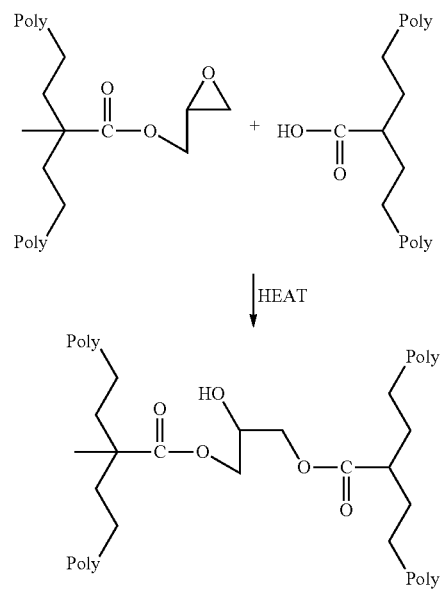

Those of skill in the art are aware that the cross-linking reaction may well proceed at temperatures that are below 135° C., or below 120° C. The kinetics of the reaction, however, are such that the blend composition may be held at 135°

C. or less for a significant amount of time (up to about 15 minutes) without cross-linking to the extent that the blend composition becomes intractable for further processing.

In addition, those of skill in the art are able to determine an appropriate level of cross-linking based on the physical properties that are desired in the cross-linked encapsulant layer. For example, higher levels of cross-linking are correlated with a higher flex modulus, better high temperature adhesion, lower melt indices, and better heat resistance.

Those of skill in the art are also aware that the time required to obtain a desired level of cross-linking depends directly on the concentration of carboxylic acid groups and epoxy groups. Likewise, the time required to obtain a desired level of cross-linking depends inversely on the temperature at which the cross-linking reaction is carried out, and also depends inversely or in another negative logarithmic relationship on the melt index of the polymer blend.

Although Scheme 1 indicates that the cross-linking reaction requires heat, the reaction may be also be carried out using catalysis, or by using a combination of heat and catalysis. Both acid and base catalysts are suitable, including without limitation, tertiary amines, phosphoric acid, Lewis acids such as boron trifluoride etherate ($BF_3.Et_2O$) and aluminum trichloride ($AlCl_3$), and substituted pyridines. Because acids can be corrosive, basic catalysts are preferred, and substituted pyridines such as 4-dimethylamino-pyridine are particularly preferred. When present, the amount of the catalyst is preferably about 20 to about 200 ppm, based on the total weight of the blend.

The effect of the catalyst on reaction times and reaction temperatures is known to those of skill in the art. Briefly, however, when a catalyst is present, the cross-linking reaction will be completed in a shorter time at a given reaction temperature, compared to a blend composition that includes the same Ethylene Copolymers 1 and 2 but no catalyst. Alternatively, the cross-linking reaction can be completed at a lower temperature, again compared to a blend composition that includes the same Ethylene Copolymers 1 and 2 but no catalyst. Those of skill in the art are capable of adjusting the amount of catalyst to attained the desired reaction temperature and time.

In addition to Ethylene Copolymer 1 and Ethylene Copolymer 2, the blend composition may further include one or more suitable additive(s) that are known in the art. Such additives include, but are not limited to, processing aids, flow enhancing additives, lubricants, pigments, dyes, optical brighteners, flame retardants, impact modifiers, nucleating agents, antiblocking agents (e.g., silica), thermal stabilizers, hindered amine light stabilizers (HALS), UV absorbers, UV stabilizers, dispersants, surfactants, chelating agents, coupling agents, adhesives, primers, reinforcement additives (e.g., glass fiber), and combinations of two or more thereof. As is discussed above, plasticizers are not suitable additives for use in the blend composition. Additives are described in detail in the *Kirk-Othmer Encyclopedia of Chemical Technology*, 5th Edition, John Wiley & Sons (New Jersey, 2004).

Suitable additives may be present in the blend composition at a level of about 0.01 to about 15 wt %, or about 0.01 to about 10 wt %, or about 0.01 to 5 wt %, or about 0.01 to 1 wt %, in total, based on the total weight of the blend composition. At these levels, the additives do not detract from the basic and novel characteristics of the blend composition, nor do they significantly adversely affect the performance of encapsulant layer comprising the blend composition.

The incorporation of the optional additives, if any, into the blend composition can be carried out by any known process, such as, for example, by dry blending, by extruding a mixture of the various constituents, by the conventional masterbatch technique, or the like. See, again, the *Kirk-Othmer Encyclopedia*. Once more, it is important to avoid carrying out these procedures under conditions that will lead to the cross-linking of the blend composition.

Four notable additives that are useful in the blend composition are thermal stabilizers, UV absorbers, hindered amine light stabilizers, and silane coupling agents. First, thermal stabilizers have been described extensively. Any known thermal stabilizer may be suitable for use in the multilayer sheet. Preferred general classes of thermal stabilizers include, but are not limited to, phenolic antioxidants, alkylated monophenols, alkylthiomethylphenols, hydroquinones, alkylated hydroquinones, tocopherols, hydroxylated thiodiphenyl ethers, alkylidenebisphenols, O-, N- and S-benzyl compounds, hydroxybenzylated malonates, aromatic hydroxybenzyl compounds, triazine compounds, aminic antioxidants, aryl amines, diaryl amines, polyaryl amines, acylaminophenols, oxamides, metal deactivators, phosphites, phosphonites, benzylphosphonates, ascorbic acid (vitamin C), hydroxylamines, nitrones, thiosynergists, benzofuranones, indolinones, and the like and mixtures thereof. The blend composition may contain any effective amount of thermal stabilizers. Use of a thermal stabilizer is optional and in some instances is not preferred. When thermal stabilizers are used, they may be present in the blend composition at a level of at least about 0.05 wt % and up to about 10 wt %, or up to about 5 wt %, or up to about 1 wt %, based on the total weight of the blend composition.

UV absorbers can be used and have also been extensively described. Any known UV absorber may be suitable for use in the blend composition. Preferred general classes of UV absorbers include, but are not limited to, benzotriazole derivatives, hydroxybenzophenones, hydroxyphenyl triazines, esters of substituted and unsubstituted benzoic acids, and the like and mixtures thereof. The blend composition may contain any effective amount of UV absorbers. Use of a UV absorber is optional and in some instances is not preferred. When UV absorbers are utilized, they may be present in the blend composition at a level of at least about 0.05 wt %, and up to about 10 wt %, or up to about 5 wt %, or up to about 1 wt %, based on the total weight of the blend composition.

Hindered amine light stabilizers (HALS) can be used and are also well known in the art. Generally, hindered amine light stabilizers are secondary, tertiary, acetylated, N-hydrocarbyloxy substituted, hydroxyl-substituted N-hydrocarbyloxy substituted, or other substituted cyclic amines which are characterized by a substantial amount of steric hindrance, generally derived from aliphatic substitution on the carbon atoms adjacent to the amine function. The blend composition may contain any effective amount of hindered amine light stabilizers. Use of hindered amine light stabilizers is optional and in some instances is not preferred. When hindered amine light stabilizers are used, they may be present in the blend composition at a level of at least about 0.05 wt %, and up to about 10 wt %, or up to about 5 wt %, or up to about 1 wt %, based on the total weight of the blend composition.

Examples of silane coupling agents that are useful in the blend compositions include, but are not limited to, γ-chloropropylmethoxysilane, vinyltrimethoxysilane, vinyltriethoxysilane, vinyltris(β-methoxyethoxy) silane, γ-vinylbenzylpropyltrimethoxysilane, N-β-(N-vinylbenzylaminoethyl)-γ-aminopropyltrimethoxysilane, γ-methacryloxypropyltrimethoxysilane, vinyltriacetoxysilane, γ-glycidoxypropyltrimethoxysilane, γ-glycidoxypropyl triethoxysilane, β-(3,4-epoxycyclohexyl)ethyltrimethoxysilane, vinyltrichloro-silane, γ-mercaptopropylmethoxysilane, γ-aminopropyltriethoxysilane, N-β-(aminoethyl)-γ-aminopropyltrimethoxysilane, and mixtures of two or more thereof. Silane coupling agents containing glycidoxy groups, such as γ-glycidoxypropyltrimethoxysilane, are preferred. The silane coupling agents are preferably incorporated in the blend composition at a level of about 0.01 to about 5 wt %, or about 0.05 to about 1 wt %, based on the total weight of the blend composition.

The encapsulant layer used in the solar cell module may be derived from a sheet comprising the blend composition. The sheet may be in a single layer or in multilayer form. The term "single layer" refers to sheets that are made of or that consist essentially of the blend composition described above. When in a multilayer form, the sheet comprises sub-layers, and at least one of the sub-layers is made of or consists essentially of the blend composition, while the other sub-layer(s) may be made of or comprise any other suitable polymeric material(s), such as, for example, copolymers of α-olefins and α,β-ethylenically unsaturated carboxylic acids (i.e., acid copolymers), partially neutralized ionic acid copolymers (i.e., ionomers), ethylene/vinyl acetate copolymers, poly(vinyl acetals) (including acoustic grade poly(vinyl acetals)), polyurethanes, polyvinylchlorides, polyethylenes (e.g., linear low density polyethylenes), polyolefin block copolymer elastomers, copolymers of α-olefins and α,β-ethylenically unsaturated carboxylic acid esters (e.g., ethylene methyl acrylate copolymers and ethylene butyl acrylate copolymers), silicone elastomers, epoxy resins, and combinations of two or more thereof.

The total thickness of the sheet comprising the blend composition may range from about 1 to about 120 mils (about 0.025 to about 3 mm), or about 10 to about 90 mils (about 0.25 to about 2.3 mm), or about 15 to about 60 mils (about 0.38 to about 1.5 mm), or about 20 to about 60 mils (about 0.51 to about 1.5 mm), or about 20 to about 45 mils (about 0.51 to about 1.14 mm). When the sheet comprising the blend composition is in a multilayer form, the inner sub-layer comprising the blend composition may have a thickness ranging from about 10 to about 30 mils (about 0.25 to about 0.76 mm) while the surface sub-layer comprising the blend composition may have a thickness of about 1 to about 5 mils (about 0.025 to about 0.12 mm).

The sheet comprising the blend composition may have a smooth or rough surface on one or both sides. Preferably, the sheet has rough surfaces on both sides to facilitate deaeration during the lamination process. Rough surfaces can be created by mechanically embossing or by melt fracture during extrusion of the sheets followed by quenching so that surface roughness is retained during handling. The surface pattern can be applied to the sheet through well-known, common art processes. For example, the extruded sheet may be passed over a specially prepared surface of a die roll positioned in close proximity to the exit of the extruder die. This imparts the desired surface characteristics to one side of the molten polymer exiting the die. Thus, when the surface of such a die roll has minute peaks and valleys, it will impart a rough surface to the side of the polymer sheet that passes over the roll, and the rough surface will generally conform respectively to the valleys and peaks of the roll surface. Such die rolls are described in, e.g., U.S. Pat. No. 4,035,549 and U.S. Patent Publication No. 2003/0124296.

The sheets comprising the blend composition may be produced by any suitable process. For example, the sheets may be formed by solution casting or dip coating. Preferred are melt processes such as cast film extrusion, compression molding, injection molding, lamination, blown film processes, extrusion coating, tandem extrusion coating, melt extrusion casting, melt coextrusion casting, melt extrusion coating, blown film processes, tandem melt extrusion coating processes, or any suitable melt processes known to those of skill in the art.

Preferably, the melt from which the sheet is formed consists essentially of Ethylene Copolymer 1, Ethylene Copolymer 2, and optional additives, if any. Also preferably, the melt is substantially free of solvents, including water and organic solvents. More preferably, the melt is substantially free of solvents and plasticizers.

When forming the melt in preparation for the extrusion process, pellets or powders of neat Ethylene Copolymers 1 and 2 may be provided.

These neat powders or pellets may be combined in a "salt and pepper" blend before melting. Alternatively, Ethylene Copolymers 1 and 2 may be pre-mixed to form pellets of the blend composition. These pellets are then melted in preparation for the extrusion process. The additives may be added to the pellets or powders before, during, or after melting.

Again, during the blending and sheeting processes, the temperature of the ethylene copolymer blend should be maintained at or below about 135° C., 130° C., 125° C. or 120° C., to avoid premature cross-linking. In some extrusion processes, the temperature of the melt is held at or below about 120° C. and the temperature at the extrusion die is about 135° C. or higher. Exposure of the unreacted blend composition to higher temperatures for short periods of time is not expected to generate an unacceptable amount of premature cross-linking.

In forming the solar cell module, the encapsulant sheet comprising the uncross-linked blend composition is laminated to the solar cell assembly. The solar cells comprised in the solar cell assembly include any article or material that can convert light into electrical energy. Solar cells useful in the invention include, but are not limited to, wafer-based solar cells (e.g., c-Si or mc-Si based solar cells, as described above in the background section) and thin film solar cells (e.g., a-Si, μc-Si, CdTe, copper indium selenide (CIS), copper-indium-gallium selenide (CIGS), light absorbing dyes, or organic semiconductor based solar cells, as described above in the background section). Within the solar cell assembly, it is preferred that the solar cells be electrically interconnected or arranged in a flat plane. In addition, the solar cell assembly may further comprise electric wirings, such as cross ribbons and bus bars.

The solar cell assembly may be bifacial. In such an embodiment, all the laminating materials positioned on either side of the solar cell assembly should be sufficiently transparent to allow adequate sunlight or reflected sunlight to reach the solar cells. Alternatively, the solar cell assembly may have a front sun-facing side (which is also referred to as a front side and, when in actual use conditions, generally faces toward the sun) and a back non-sun-facing side (which is also referred to as a back side and, when in actual use conditions, generally faces away from the sun). The solar cells define the boundary between the front and back sides of the solar cell assembly. In such an assembly, all the materials that are present in the laminate layers positioned in the front sun-facing side of the solar cell assembly should have sufficient transparency to allow adequate sunlight to reach the solar cells. The materials present in the laminate layers positioned in the back non-sun-facing side of the solar cell layer need not be transparent.

Further in this connection, copolymers consisting of copolymerized residues of ethylene and alpha, beta-unsaturated carboxylic acids such as the second olefin may have a degree of crystallinity that is relatively high. The same is true of copolymers consisting of copolymerized residues of ethylene and epoxy-functionalized olefins such as the third olefin. Crystallinity can contribute to haze and lower transmission of light. Ethylene acid copolymers that include a third comonomer that is an ester of an alpha, beta-unsaturated carboxylic acid, such as the first olefin, in general have lower levels of crystallinity. Therefore, when the blend composition described herein is used in a front encapsulant layer, it is preferred that at least one of Ethylene Copolymers 1 and 2 comprise the first olefin. More preferably, both Ethylene Copolymer 1 and Ethylene Copolymer 2 comprise the first olefin.

The solar cell module typically comprises at least one encapsulant layer comprising the blend composition, which is laminated to the solar cell assembly. Two components that are "laminated" to each other are bonded either directly (i.e., without any additional material between the two layers) or indirectly (i.e., with additional material, such as interlayer or adhesive materials, between the two layers). In certain laminates, the encapsulant layer comprising the blend composition is directly bonded to the solar cell layer.

Solar cell assemblies may have somewhat uneven surfaces with peaks and voids. Therefore, during the lamination process, the encapsulant sheet comprising the blend composition will melt or soften to some degree, and will typically flow around the peaks and fill the voids of the solar cell assembly. Accordingly, when the thickness of the encapsulant layer is provided herein, unless otherwise specified in limited circumstances, it is the thickness of the encapsulant layer prior to lamination. In general, however, the encapsulant layer in the final module remains at an average total thickness of about 1 to about 120 mils (about 0.025 to about 3 mm), or about 10 to about 90 mils (about 0.25 to about 2.3 mm), or about 15 to about 60 mils (about 0.38 to about 1.5 mm), or about 20 to about 60 mils (about 0.51 to about 1.5 mm), or about 20 to about 45 mils (about 0.51 to about 1.14 mm).

The cross-linkable blend compositions described herein as encapsulant materials have a number of advantages over cross-linkable EVA compositions. For example, the blend compositions described herein can be made into sheets at an extrusion temperature as high as about 135° C. without undergoing a significant degree of cross-linking. Further, the relatively low initial viscosity of the blend compositions described herein also allows the encapsulant material to fully flow around the solar cell assembly during lamination and therefore minimize cell breakage. Yet further, the incorporation of the olefin of the formula $CH_2=C(R^1)CO_2R^2$ (such as n-butyl acrylate) as a comonomer in one or both of Ethylene Copolymers 1 and 2 reduces the blend compositions' crystallinity and therefore improves the clarity of the encapsulant layer.

The solar cell module may further comprise additional encapsulant layers comprising other polymeric materials, such as acid copolymers, ionomers, ethylene/vinyl acetate copolymers, poly(vinyl acetals) (including acoustic grade poly(vinyl acetals)), polyurethanes, poly(vinyl chlorides), polyethylenes (e.g., linear low density polyethylenes), polyolefin block copolymer elastomers, copolymers of α-olefins and α,β-ethylenically unsaturated carboxylic acid esters) (e.g., ethylene methyl acrylate copolymers and ethylene butyl acrylate copolymers), silicone elastomers, epoxy resins, and combinations of two or more thereof.

The solar cell module may further comprise an incident layer and/or a backing layer serving as the outermost layer or layers of the module at the sun-facing side and the non-sun-facing side of the solar cell module, respectively. The incident layer and the backing layer may comprise any suitable sheet or film. Suitable sheets include, for example, glass or plastic sheets, such as polycarbonates, acrylics, polyacrylates, cyclic polyolefins (e.g., ethylene norbornene polymers), polystyrenes (preferably polystyrenes prepared in the presence of metallocene catalysts), polyamides, polyesters, fluoropolymers, or combinations of two or more thereof. In addition, metal sheets, such as aluminum, steel, galvanized steel, or ceramic plates may be used in the backing layer.

The term "glass" includes not only window glass, plate glass, silicate glass, sheet glass, low iron glass, tempered glass, tempered CeO-free glass, and float glass, but also colored glass, specialty glass (such as those containing ingredients to control solar heating), coated glass (such as those sputtered with metals (e.g., silver or indium tin oxide) for solar control purposes), low E-glass, Toroglas™ glass (Saint-Gobain N.A. Inc., Trumbauersville, Pa.), Solexia™ glass (PPG Industries, Pittsburgh, Pa.) and Starphire™ glass (PPG Industries). Such specialty glasses are described in, e.g., U.S. Pat. Nos. 4,615,989; 5,173,212; 5,264,286; 6,150,028; 6,340,646; 6,461,736; and 6,468,934. It is understood, however, that the type of glass to be selected for a particular module depends on the intended use.

Suitable films for the incident layer or the backing layer comprise polymers that include but are not limited to, polyesters (e.g., poly(ethylene terephthalate) and poly(ethylene naphthalate)), polycarbonate, polyolefins (e.g., polypropylene, polyethylene, and cyclic polyolefins), norbornene polymers, polystyrene (e.g., syndiotactic polystyrene), styrene-acrylate copolymers, acrylonitrile-styrene copolymers, polysulfones (e.g., polyethersulfone, polysulfone, etc.), nylons, poly(urethanes), acrylics, cellulose acetates (e.g., cellulose acetate, cellulose triacetates, etc.), cellophane, silicones, poly(vinyl chlorides) (e.g., poly(vinylidene chloride)), fluoropolymers (e.g., polyvinyl fluoride, polyvinylidene fluoride, polytetrafluoroethylene, and ethylene-tetrafluoroethylene copolymers), and combinations of two or more thereof. The polymeric film may be non-oriented, or uniaxially oriented, or biaxially oriented.

Specific examples of films that may be used in the solar cell module outer layers (e.g., the incident layer or the backing layer) include, but are not limited to, polyester films (e.g., poly(ethylene terephthalate) films), fluoropolymer films (e.g., Tedlar®, Tefzel®, and Teflon® films available from DuPont). Metal films, such as aluminum foil, may also be used as the backing layers. Further the films used in the solar cell module outer layers may be in the form of multi-layer films, such as a fluoropolymer/polyester/fluoropolymer multilayer film (e.g., Tedlar®/PET/Tedlar® or TPT laminate film available from Isovolta AG of Austria or from Madico of Woburn, Mass.).

The solar cell module may further comprise other functional film or sheet layers (e.g., dielectric layers or barrier layers) embedded within the module. Such functional layers may comprise any of the above mentioned polymeric films or those that are coated with additional functional coatings.

For example, poly(ethylene terephthalate) (PET) films coated with a metal oxide coating, such as those described in U.S. Pat. Nos. 6,521,825 and 6,818,819 and European Patent No. 1182710, may function as oxygen and moisture barrier layers in the laminates.

If desired, a layer of nonwoven glass fiber (scrim) may also be included between the solar cell layers and the encapsulant layers to facilitate deaeration during the lamination process and/or to serve as reinforcement for the encapsulants. The use of such scrim layers is described in, e.g., U.S. Pat. Nos. 5,583,057; 6,075,202; 6,204,443; 6,320,115; and 6,323,416 and European Patent No. 0769818.

A special film or sheet may be included to serve both the function of an encapsulant layer and an outer layer. One example of such a special sheet is Spallshield®, available from DuPont. Furthermore, any two or more of the contiguous film or sheet layers included in the module may be supplied in the form of a pre-formed multilayer film or sheet.

One or both surfaces of the incident layer films and sheets, the backing layer films and sheets, the encapsulant layers and other layers incorporated within the solar cell module may optionally undergo any suitable adhesion enhancing treatment. This adhesion enhancing treatment may take any form known within the art and includes flame treatments (see, e.g., U.S. Pat. Nos. 2,632,921; 2,648,097; 2,683,894; and 2,704,382), plasma treatments (see e.g., U.S. Pat. No. 4,732,814), electron beam treatments, oxidation treatments, corona discharge treatments, chemical treatments, chromic acid treatments, hot air treatments, ozone treatments, ultraviolet light treatments, sand blast treatments, solvent treatments, and combinations of two or more thereof.

Also, the adhesion strength may be further improved by further applying an adhesive or primer coating on the surface of the laminate layer(s). For example, U.S. Pat. No. 4,865,711 describes a film or sheet with improved bondability, which has a thin layer of carbon deposited on one or both surfaces. Other examples of suitable adhesives and primers include, without limitation, silanes, poly(allyl amine) based primers (see e.g., U.S. Pat. Nos. 5,411,845; 5,770,312; 5,690,994; and 5,698,329), and acrylic based primers (see e.g., U.S. Pat. No. 5,415,942). The adhesive or primer coating may take the form of a monolayer of the adhesive or primer and have a thickness of about 0.0004 to about 1 mil (about 0.00001 to about 0.03 mm), or preferably, about 0.004 to about 0.5 mil (about 0.0001 to about 0.013 mm), or more preferably, about 0.004 to about 0.1 mil (about 0.0001 to about 0.003 mm).

Referring now to the drawings, wherein like reference numerals designate corresponding structure throughout the views, and referring in particular to FIG. 1, when the solar cells are derived from wafer-based, self supporting solar cell units, the solar cell module (10) may comprise, in order of position from the front sun-facing side to the back non-sun-facing side, (a) an incident layer (11), (b) a front encapsulant layer (12), (c) a solar cell assembly (13) comprised of one or more electrically interconnected solar cells, (d) a back encapsulant layer (14), and (e) a backing layer (15), wherein one or both of the front and back encapsulant layers (12 and 14) comprises the cross-linkable blend composition. In such a module, it is also possible that the solar cell assembly (13) may have a smaller lateral area compared to the encapsulant layers (12 and 14) and the outer protective layers (11 and 15). In this configuration, the two encapsulant layers (12 and 14) may come in contact over the peripheral edges of the solar cell assembly (13) and bond to each other, forming a seal (16) around the edges of the solar cell assembly (13).

Figure 2:
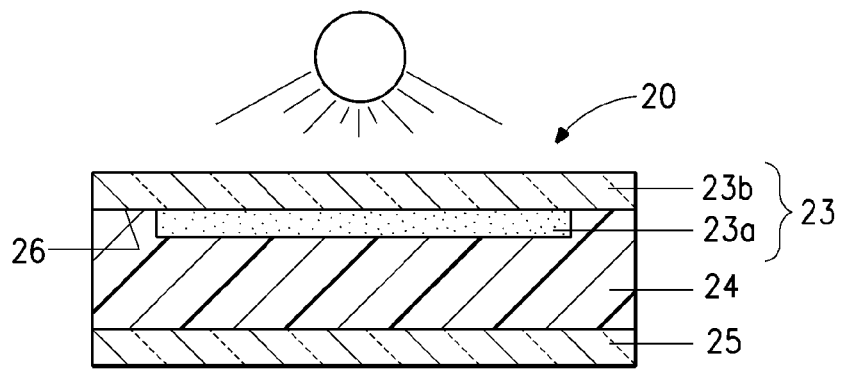
FIG. 2 is a cross-sectional view of a second solar cell module, not drawn to scale.
Figure 3:
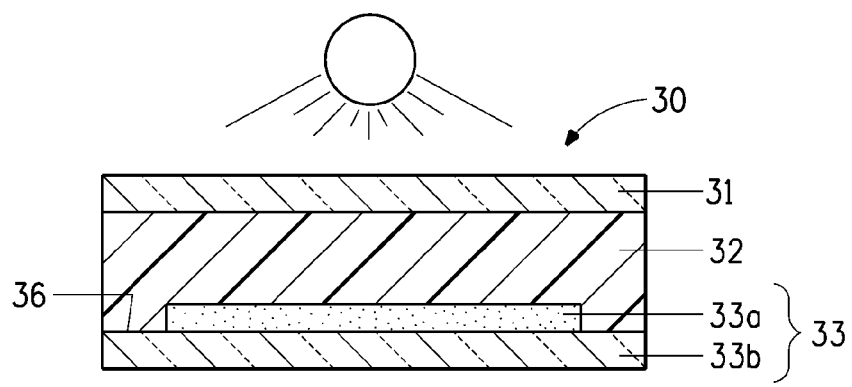
FIG. 3 is a cross-sectional view of a third solar cell module, not drawn to scale.

Referring now to FIG. 2, when the solar cell module 20 is derived from thin film solar cells, it may comprise, in order of position from the front sun-facing side to the back non-sun-facing side, (a) a solar cell layer (23) comprising a superstrate (23*b*) and a layer of thin film solar cell(s) (23*a*) deposited thereon at the non-sun-facing side, (b) a (back) encapsulant layer (24) comprising the cross-linkable blend composition, and (c) a backing layer (25). Referring now to FIG. 3, another solar cell module 30 that is derived from thin film solar cells may comprise, again in order of position from the front sun-facing side to the back non-sun-facing side, (a) a transparent incident layer (31), (b) a (front) encapsulant layer (32) comprising the cross-linkable blend composition, and (c) a solar cell layer (33) comprising a layer of thin film solar cell(s) (33*a*) deposited on a substrate (33*b*) at the sun-facing side thereof.

Once more, thin films solar cells (23*a* or 33*a*) may have a smaller lateral area than that of the superstrate (23*b*) or substrate (33*b*) and that of the encapsulant layer (24 or 32), and therefore, the encapsulant layer (24 or 32) may come in contact and bond with the superstrate (23*b*) or substrate (33*b*) over the peripheral edges of the thin film solar cells (23*a* or 33*a*) and form a seal (26 or 36) around the edges of the thin film solar cells (23*a* or 33*a*).

If desired, the edges of the solar cell module may be sealed to reduce moisture and air intrusion that lead to potential reduction of the efficiency and lifetime of the solar cell(s). The edges may be sealed by any means disclosed within the art. Suitable edge seal materials include, but are not limited to, butyl rubber, polysulfide, silicone, polyurethane, polypropylene elastomers, polystyrene elastomers, block copolymer elastomers (such as styrene-ethylene-butylene-styrene (SEBS)), and the like.

Moreover, a plurality of the solar cell modules described above may be further linked in parallel or in series to form a solar cell array, in order to produce a desired voltage and current.

Any suitable lamination process may be used to prepare the solar cell modules. In general, however, processes including a step in which the blend of Ethylene Copolymer 1 and Ethylene Copolymer 2 is heated to a temperature of about 135° C. or higher, or of about 140° C. to about 180° C., are preferred. As is described in detail above, the cross-links between Ethylene Copolymer 1 and Ethylene Copolymer 2 form during this high-temperature step, and the rate at which the reaction proceeds depends on the temperature and melt index of the blend, on the concentration of catalyst, if any, and on the concentration of the reactive monomers.

In laminates, however, the rate at which the cross-linking reaction proceeds also depends on the heat transfer rate, or, more practically, on the structure of the laminate. For example, laminates comprising outer layers made from materials such as polycarbonate sheets, which have low heat transfer coefficients, may require heating at higher temperatures or for longer times than laminates that comprise glass outer layers, with their higher heat transfer coefficients. Alternatively, compared to laminates comprising glass sheets as outer layers, laminates comprising polyester films as their outer layers may require less time or lower temperatures to achieve the desired level of crosslinking. Although polyesters may have a lower heat transfer coefficient than glass, the relative small thickness of the polyester films will allow for quicker heating than the relatively thicker glass sheets.

The following specific examples of suitable lamination processes are not limiting. In one process, the component layers of the solar cell module are stacked in the desired order to form a pre-lamination assembly. The assembly is then placed into a bag capable of sustaining a vacuum ("a vacuum bag"), the air is drawn out of the bag by a vacuum line or other means, the bag is sealed while the vacuum is maintained (e.g., at least about 27-28 in. Hg (689-711 mm Hg)), and the sealed bag is placed in an autoclave and the pressure is raised to about 150 to about 250 psi (about 11.3 to about 18.8 bar), and a temperature of about 135° C. to about 180° C., or about 135° C. to about 160° C., or about 135° C. to about 155° C., or about 145° C. to about 155° C., for about 10 to about 50 min, or about 20 to about 45 min, or about 20 to about 40 min, or about 25 to about 35 min. A vacuum ring may be substituted for the vacuum bag. One type of suitable vacuum bag is described in U.S. Pat. No. 3,311,517. Following the heat and pressure cycle, the air in the autoclave is cooled without adding additional air to maintain pressure in the autoclave. After about 20 min of cooling, the excess air pressure is vented and the laminates are removed from the autoclave.

Alternatively, the pre-lamination assembly may be heated in an oven at about 80° C. to about 120° C., or about 90° C. to about 100° C., for about 20 to about 40 min, and thereafter, the heated assembly may be passed through a set of nip rolls so that the air in the void spaces between the individual layers is squeezed out, and the edge of the assembly sealed. The assembly at this stage is referred to as a pre-press.

The pre-press may then be placed in an air autoclave where the temperature is raised to about 135° C. to about 180° C., or about 135° C. to about 160° C. at a pressure of about 100 to about 300 psi (about 6.9 to about 20.7 bar), or preferably about 200 psi (13.8 bar). These conditions are maintained for about 15 to about 60 min, or about 20 to about 50 min, after which the air is cooled while no further air is introduced to the autoclave. After about 20 to about 40 min of cooling, the excess air pressure is vented and the laminated products are removed from the autoclave.

The solar cell modules may also be produced through non-autoclave processes. Such non-autoclave processes are described, e.g., in U.S. Pat. Nos. 3,234,062; 3,852,136; 4,341,576; 4,385,951; 4,398,979; 5,536,347; 5,853,516; 6,342,116; and 5,415,909; in U.S. Patent Publication No. 2004/0182493; in European Patent No. 1235683 B1; and in PCT Patent Publication Nos. WO91/01880 and WO03/057478. Generally, the non-autoclave processes include heating the pre-lamination assembly and the application of vacuum, pressure or both. For example, the assembly may be successively passed through heating ovens and nip rolls.

The following examples are provided to describe the invention in further detail. These examples, which set forth a preferred mode presently contemplated for carrying out the invention, are intended to illustrate and not to limit the invention.

EXAMPLES

Example 1

Two ethylene copolymers were blended at 120° C. for 5 minutes in a Brabender mixer. The first ethylene copolymer had a melt flow rate (MFR) of 300 g/10 min and comprised copolymerized units of ethylene (65.8 wt %), n-butyl acrylate (28 wt %), and acrylic acid (6.2 wt %). The second ethylene copolymer had a MFR of 8 g/10 min and comprised copolymerized units of ethylene (66 wt %), n-butyl acrylate (25 wt %), and glycidyl methacrylate (9 wt %). The weight ratio of the first ethylene copolymer to the second ethylene copolymer was 60 to 40. The molar ratio between the acid group in the first ethylene copolymer and the glycidyl group in the second ethylene copolymer was 2.04 to 1. The MFR of the blend of the two ethylene copolymers remained at above 200 g/10 min. (All MFR reported herein were determined in accordance with ASTM D1238 at 190° C. and 2.16 kg, and are reported in units of g/10 min, unless otherwise specified in limited circumstances.)

A plaque having a thickness of 30 mil was formed by compression molding a portion of the blend at 160° C. for 15 minutes. When the measurement of the MFR of the plaque was attempted, only a hard gel formed in the melt indexer. It was therefore concluded that the polymer blend in the plaque was cross-linked. Moreover, the plaque was clear, with a total transmission value of 92%, as measured with a HunterLab Color Quest XE spectrophotometer. The plaque also had a tensile modulus of 886 psi, as measured by ASTM D1708 at ambient temperature on 19 mil thick microtensile bars using an Instru-Met (Model 1122) and a test speed of 2 in/min.

In addition, a second plaque having a thickness of 30 mil was formed by compression molding a second portion of the blend at 120° C. for 5 minutes, conditions under which no cross-linking occurs. The uncross-linked plaque without silane or any other primers was laminated between a layer of glass and a layer of Tedlar® polyvinyl fluoride film (DuPont, supplied by Krempel as Supp 2242, RONOF 050423-002) in a Meier ICO LAM 10/08 laminator under the following conditions: 5 minutes vacuum at 170° C. and 10 minutes under pressure at 170° C. (−800 mbar). The as-obtained laminate structure was conditioned under damp heat (85° C. and 85% humidity) for 1800 hours. After this conditioning, the adhesion between the plaque and the glass and the adhesion between the plaque and the Tedlar® film remained strong. In addition, peel strength was measured on 1-inch strips of the laminate with an Instron (model 1122), with a peel rate of 100 mm/min, peel angle of 180 degrees. The peel force of the plaque from the glass exceeded 20 kg/in.

Example 2

Two ethylene copolymers were blended at 120° C. for 5 minutes in a Brabender mixer. The first ethylene copolymer had a melt flow rate (MFR) of 210 g/10 min and comprised copolymerized units of ethylene (65.8 wt %), n-butyl acrylate (28 wt %), and acrylic acid (6.2 wt %). The second ethylene copolymer had a MFR of 12 g/10 min and comprised copolymerized units of ethylene (66.75 wt %), n-butyl acrylate (28 wt %), and glycidyl methacrylate (5.25 wt %). The weight ratio of the first ethylene copolymer to the second ethylene copolymer was 60 to 40. The molar ratio between the acid group in the first ethylene copolymer and the glycidyl group in the second ethylene copolymer was 3.5 to 1. The MFR of the blend of the two ethylene copolymers was 70 g/10 min.

A clear plaque having a thickness of 125 mil was formed by compression molding a portion of the blend at 175° C. for 15 minutes. When the measurement of the MFR of the clear plaque was attempted, only a hard gel formed in the melt indexer. It was therefore concluded that the polymer blend in the clear plaque was cross-linked.

Example 3

Two ethylene copolymers were blended at 120° C. for 5 minutes in a Brabender mixer. The first ethylene copolymer had a melt flow rate (MFR) of 60 g/10 min and comprised copolymerized units of ethylene (65.8 wt %), n-butyl acrylate (28 wt %), and acrylic acid (6.2 wt %). The second ethylene copolymer had a MFR of 12 g/10 min and comprised copolymerized units of ethylene (66.75 wt %), n-butyl acrylate (28 wt %), and glycidyl methacrylate (5.25 wt %). The weight ratio of the first ethylene copolymer to the second ethylene copolymer was 60 to 40. The molar ratio between the acid group in the first ethylene copolymer and the glycidyl group in the second ethylene copolymer was 3.5 to 1. The MFR of the blend of the two ethylene copolymers was 25 g/10 min.

A clear plaque having a thickness of 125 mil was formed by compression molding a portion of the blend at 175° C. for 15 minutes. When the measurement of the MFR of the clear plaque was attempted, only a hard gel formed in the melt indexer. It was therefore concluded that the polymer blend in the clear plaque was cross-linked.

Example 4

Two ethylene copolymers were blended at 120° C. for 5 minutes in a Brabender mixer. The first ethylene copolymer had a melt flow rate (MFR) of 210 g/10 min and comprised copolymerized units of ethylene (65.8 wt %), n-butyl acrylate (28 wt %), and acrylic acid (6.2 wt %). The second ethylene copolymer had a MFR of 8 g/10 min and comprised copolymerized units of ethylene (66.0 wt %), n-butyl acrylate (25 wt %), and glycidyl methacrylate (9 wt %). The weight ratio of the first ethylene copolymer to the second ethylene copolymer was 60 to 40. The molar ratio between the acid group in the first ethylene copolymer and the glycidyl group in the second ethylene copolymer was 2.04 to 1. The MFR of the blend of the two ethylene copolymers was 57 g/10 min.

A clear plaque having a thickness of 125 mil was formed by compression molding a portion of the blend at 175° C. for 15 minutes. When the measurement of the MFR of the clear plaque was attempted, only a hard gel formed in the melt indexer. It was therefore concluded that the polymer blend in the clear plaque was cross-linked.

Example 5

Three hundred grams of two ethylene copolymers and a silane were blended at 120° C. for 5 minutes in a Brabender mixer (50 rpm). The first ethylene copolymer had a melt index (MI) of 12, and comprised copolymerized units of ethylene (66.75 wt %), n-butyl acrylate (28 wt %), and glycidyl methacrylate (5.25 wt %). The second ethylene copolymer had a MI of 60 and comprised copolymerized units of ethylene (66.0 wt %), n-butyl acrylate (28 wt %), and acrylic acid (6 wt %). The blend was 59.5 wt % of the first ethylene copolymer, 40 wt % of the second ethylene copolymer, and 0.5 wt % of the silane (gamma-glycidoxypropyltrimethyoxysilane). The MI of the blend was 20 (measured at 125° C. and extrapolated to 190° C.). The melt flow (in a 10 minute period) was measured in a melt indexer with a 2160 gram weight at several different temperatures after being held at the specific temperature in the melt indexer for 10 minutes. The results are set forth in the Table below:

| Temperature, ° C. | Melt Flow |
| --- | --- |
| 130 | 3.71 |
| 140 | 4.43 |
| 150 | 2.54 |
| 160 | 0.007 |
| 170 | 0.0 |

These results show that crosslinking occurs as the temperature in the melt indexer is raised, and that the blend becomes completely crosslinked at 160° C. Therefore, it is believed that a sheet made from this blend and used as a solar cell encapsulant will be completely crosslinked when laminated for 10 minutes at 160° C.

Additionally, a plaque (20 mil thickness) of the uncrosslinked blend was prepared by compression molding at 120° C. and holding at that temperature for 2 minutes. Based on the results set forth above, no crosslinking occurs under these conditions.

A pre-press assembly was laid up by stacking, in the order given, the following layers: glass/Teflon® 500A FEP 100/ TPT [Tedlar®/PET/Tedlar®]/Encapsulant/Teflon®500A FEP 100 slip sheet/glass. The encapsulant was the 20 mil plaque of the uncrosslinked blend. Each layer had the dimensions 4 inches by 6 inches, excepting the Teflon® slip sheet, whose dimensions were 1.5 inches by 4 inches. The glass was used as received from St. Gobain (Diamant solar glass). The Teflon® FEP 500A was used as received from DuPont. The TPT (Tedlar®/Poly(ethylene) terephthalate/Tedlar®) was used as received from Krempel. The Teflon® film slip sheet was placed between the perfluorinated copolymer resin film and the sample film at one end of the overlay to provide an unlaminated (unadhered) region to serve as an initiation point for subsequent peel tests.

The pre-press assembly was placed in a vacuum bag and was vacuum laminated using a VWR Programmable Oven, Model No. 1685. To begin the heating cycle, the structure was heated from ambient temperature (~25° C.) to 140° C. in 15 minutes and then held at that temperature for 5 minutes. Then it was heated to 170° C. and held for 10 minutes. The encapsulant blend was completely crosslinked under these conditions, as shown by the data in the table above.

The peel strength (180 degree peel at 10 inches/min) of the encapsulant to glass was measured both before and after being exposed to damp heat (85° C., 85% relative humidity) in a damp heat chamber (Tenny Product Solutions, Model No. BTRC) for 1180 hours. Peel strength was determined to be 78 psi before exposure and 91 psi after exposure as measured on an Instru-Met adhesion tester, Model No. 1122.

The percent transmittance of the structure was measured at three different wavelengths on a Hunter Lab Color Quest XE spectrophotometer, with the following results:

| Wavelength, nm | % Transmittance |
| --- | --- |
| 400 | 90.79 |
| 550 | 91 |
| 700 | 91.56 |

Example 6

Three hundred grams of a blend of 40 wt % the first ethylene copolymer and 59.925 wt % of the second ethylene copolymer used in Example 5, above, with 0.0175 wt % of 4-dimethylaminopyridine were mixed in a Brabender mixer at 120° C. at 50 rpm for 5 minutes. The MI of the blend was 15 (measured at 125° C. and extrapolated to 190° C.). The flow of the blend was measured in a melt indexer in a 10 minute period with a 2160 gram weight at several different temperatures, after being held at the specific temperature in the melt indexer for 10 minutes. The results are set forth in the table below:

| Temperature, ° C. | Melt Flow |
| --- | --- |
| 130 | 2.85 |
| 140 | 2.12 |
| 150 | 0.38 |
| 160 | 0.0 |

A second blend of the first and the second ethylene copolymer was made. The second blend was similar to the blend described above and made under similar conditions, but did not include the 4-dimethylamino-pyridine. When the melt flow of the second blend was measured by the procedure described above, the following results were obtained:

| Temperature, °C. | Melt Flow |
| --- | --- |
| 130 | 3.6 |
| 140 | 4.4 |
| 150 | 2.5 |
| 160 | 0.1 |
| 170 | 0.0 |

These results show that the rate of crosslinking can be increased with the addition of a basic catalyst. The crosslinking occurred faster at each specified temperature as evidenced by decreased flow relative to the uncatalyzed reaction. The melt flow obtained at 125° C. (MI=15.3; value calculated for 190° C.) for the catalyzed blend is compatible with extrusion and lamination processing conditions. Therefore, it is possible to use a catalyst to increase the rate of the reaction when forming an encapsulant sheet from this blend, without causing premature crosslinking.

Example 7

Three hundred grams of a blend of a first ethylene copolymer (89 wt % ethylene, 11 wt % methacrylic acid, MI=100 g/10 min) and the second ethylene copolymer described in Example 5, above, were mixed in a Brabender mixer at 120° C. at 50 rpm for 5 minutes. The blend composition was 60 wt % of the first ethylene copolymer and 40 wt % of the second ethylene copolymer. The melt index (MI) of the blend was 45 (measured at 125° C. and extrapolated to 190° C.). The flow of the blend (in a 10 minute period) in a melt indexer equipped with a 2160 gram weight was determined at several different temperatures after being held at the specific temperature in the melt indexer for 10 minutes. The results were:

| Temperature, °C. | Melt Flow |
| --- | --- |
| 130 | 4.77 |
| 140 | 7.39 |
| 150 | 9.65 |
| 160 | 9.60 |
| 170 | 0.0 |

Example 8

Pellets of the crosslinkable blend described in Example 1 were compression molded with an 8 mil sheet of untreated poly(ethylene terephthalate) (PET) at 160° C. for 10 minutes. After molding, the thickness of the layer of the crosslinked blend was approximately 20 mils. This laminate was non-peelable, showing excellent adhesion. Specifically, the blend could not be separated from the 8 mil PET initially or after 1000 hours of damp heat (85° C. and 85% RH).

While certain of the preferred embodiments of the present invention have been described and specifically exemplified above, it is not intended that the invention be limited to such embodiments. Rather, it is to be understood that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. A solar cell module comprising a solar cell assembly and at least one encapsulant layer, wherein the at least one encapsulant layer consists essentially of a blend composition or a product of cross-linking the blend composition, said blend composition consisting and an Ethylene Copolymer 2, and optionally, one or more additives; wherein said Ethylene Copolymer 1 consists essentially of copolymerized units of ethylene, optionally about 5 to about 40 wt% of copolymerized units of a first olefin having a formula of $H_2C=C(R^1)CO_2R^2$, and about 2 to about 30 wt% of copolymerized units of a second olefin having a formula of $CH_2=C(R^3)COOH$, wherein the weight percentages of the copolymerized units of the first olefin and of the second olefin are based on the total weight of said Ethylene Copolymer 1; wherein $R^1$ represents hydrogen or an alkyl group, $R^2$ represents an alkyl group, and $R^3$ represents hydrogen or an alkyl group; and wherein said Ethylene Copolymer 2 consists essentially of copolymerized units of ethylene, optionally up to about 40 wt % of copolymerized units of the first olefin, and about 3 to about 15 wt % of copolymerized units of a third olefin having a formula of $CH_2=C(R^4)$-D, wherein the weight percentages of the copolymerized units of the first olefin and of the third olefin are based on the total weight of said Ethylene Copolymer 2; wherein $R^4$ represents hydrogen or an alkyl group; wherein -D represents a moiety selected from the group consisting of $—CO_2R^5$, $-CO_2R^6-R^5$, $-R^6-R^5$, $-O-R^5$, and $R^5$; wherein $R^5$ represents a moiety containing an epoxy group and $R^6$ represents an alkylene group;

with the proviso that none of said first, second or third olefins is a dicarboxylic acid or a di-ester, mono-ester or anhydride of the dicarboxylic acid; wherein the one or more optional additives are selected from the group consisting of processing aids, flow enhancing additives, lubricants, pigments, dyes, optical brighteners, flame retardants, impact modifiers, nucleating agents, anti-blocking agents, thermal stabilizers, hindered amine light stabilizers, UV absorbers, UV stabilizers, dispersants, surfactants, chelating agents, coupling agents, adhesives, primers, and reinforcement additives.

2. The solar cell module of claim 1, wherein at least a portion of the carboxylic acid groups of Ethylene Copolymer 1 are reacted with at least a portion of the epoxy groups of Ethylene Copolymer 2 to form cross-links between Ethylene Copolymer 1 and Ethylene Copolymer 2.

3. The solar cell module of claim 1, wherein $R^1$ represents hydrogen or a methyl group, $R^2$ represents a butyl group, $R^3$ represents hydrogen or a methyl group, $R^4$ represents hydrogen or a methyl group, and -D is $—R^5$, wherein $R^5$ represents a moiety containing a glycidyl group.

4. The solar cell module of claim 1, wherein the first olefin is n-butyl acrylate and the second olefin is acrylic acid.

5. The solar cell module of claim 1, wherein the third olefin is glycidyl methacrylate.

6. The solar cell module of claim 1, further comprising a film layer, wherein the film layer is in direct contact with the encapsulant layer, and wherein the film layer comprises poly(ethylene terephthalate).

7. The solar cell module of claim 1, wherein the second olefin comprises acrylic acid and methacrylic acid.

8. The solar cell module of claim 1, wherein Ethylene Copolymer 1 or Ethylene Copolymer 2 further comprises copolymerized residues of one or more additional comonomers.

9. The solar cell module of claim 1, wherein the blend composition consists essentially of about 10 to about 90 wt% of Ethylene Copolymer 1 and about 10 to about 90 wt% of Ethylene Copolymer 2, based on the total weight of the blend composition.

10. The solar cell module of claim 1, wherein the blend composition further comprises the impact modifier.

11. The solar cell module of claim 1, wherein the blend composition further comprises the processing aid.

12. The solar cell module of claim 1, wherein the blend composition further comprises the pigment, the dye or the optical brightener.

13. The solar cell module of claim 1, wherein the blend composition further comprises the coupling agent.

14. The solar cell module of claim 1, wherein the blend composition further comprises the UV absorber, the hindered amine light stabilizer, and the thermal stabilizer.

15. The solar cell module of claim 14, wherein the UV absorber is selected from the group consisting of a hydroxyphenyl triazine, a benzotriazole, and a combination of a hydroxyphenyl triazine and a benzotriazole; wherein the thermal stabilizer is selected from the group consisting of a phosphite, a triazine, and a combination of a phosphite and a triazine; and wherein the hindered amine light stabilizer is selected from the group consisting of sterically hindered cyclic secondary amines.

16. The solar cell module of claim 1, wherein the coupling agent comprises a silane coupling agent.

17. The solar cell module of claim 16, wherein the silane coupling agent comprises a glycidoxy group.

18. The solar cell module of claim 16, wherein the silane coupling agent comprises γ-glycidoxypropyltrimethoxysilane.

19. The solar cell module of claim 1, wherein the blend composition further comprises a catalyst.

20. The solar cell module of claim 1, wherein Ethylene Copolymer 2 is a copolymer of ethylene, vinyl acetate, and glycidyl methacrylate.

21. A process for preparing the solar cell module of claim 1, comprising: (i) providing a solar cell assembly and at least one encapsulant layer, wherein the at least one encapsulant layer consists essentially of the blend composition, wherein the blend composition is uncross-linked, and wherein the at least one encapsulant layer is formed by extrusion from the melt at a temperature of about 135° C. or lower; and (ii) laminating the assembly at a lamination temperature of about 135° C. or higher to provide a solar cell module wherein the blend composition is cross-linked.

22. The process of claim 21, wherein the laminating step is conducted by subjecting the assembly to heat and optionally vacuum or pressure.

* * * * *